United States Patent
Matsumoto et al.

(10) Patent No.: US 9,269,922 B2
(45) Date of Patent: Feb. 23, 2016

(54) ORGANIC EL DISPLAY DEVICE

(71) Applicant: Japan Display Inc., Tokyo (JP)

(72) Inventors: Yuko Matsumoto, Tokyo (JP); Toshihiro Sato, Tokyo (JP); Hiroshi Oooka, Tokyo (JP)

(73) Assignee: Japan Display Inc., Tokyo ( * ) Notice: Subject to any disclaimer, the term of this patent is extended or adjusted under 35 U.S.C. 154(b) by 0 days.

(21) Appl. No.: 14/146,807

(22) Filed: Jan. 3, 2014

(65) Prior Publication Data

US 2014/0191216 A1    Jul. 10, 2014

(30) Foreign Application Priority Data

Jan. 4, 2013  (JP) .................. 2013-000247

(51) Int. Cl.
| | |
|---|---|
| *H01L 25/03* | (2006.01) |
| *H01L 51/52* | (2006.01) |
| *H01L 51/54* | (2006.01) |
| *H01L 27/32* | (2006.01) |

(52) U.S. Cl.
CPC ........ *H01L 51/5246* (2013.01); *H01L 51/5265* (2013.01); *H01L 51/5268* (2013.01); *H01L 51/5284* (2013.01); *H01L 27/322* (2013.01); *H01L 27/3244* (2013.01); *H01L 2251/5315* (2013.01)

(58) Field of Classification Search
None
See application file for complete search history.

(56) References Cited

U.S. PATENT DOCUMENTS

| | | | | |
|---|---|---|---|---|
| 2006/0043888 | A1* | 3/2006 | Nakagawa et al. | 313/506 |
| 2007/0063645 | A1* | 3/2007 | Yokoyama | 313/506 |
| 2011/0133636 | A1* | 6/2011 | Matsuo et al. | 313/504 |
| 2011/0298361 | A1* | 12/2011 | Matsunaga et al. | 313/504 |
| 2013/0331474 | A1* | 12/2013 | Kida et al. | 522/39 |
| 2014/0152637 | A1* | 6/2014 | Fujita et al. | 345/211 |

FOREIGN PATENT DOCUMENTS

| | | |
|---|---|---|
| JP | 11-329742 | 11/1999 |
| WO | WO 2012157634 A1 * | 11/2012 |

* cited by examiner

*Primary Examiner* — Joseph Schoenholtz
(74) *Attorney, Agent, or Firm* — Typha IP LLC

(57) ABSTRACT

An organic EL display device includes a first substrate, a plurality of organic EL devices arranged on the first substrate, a second substrate arranged above the first substrate, and a filling layer arranged between the first substrate and the second substrate, and displays an image on the second-substrate side. The organic EL display device is characterized in that: the organic EL devices each have a light-emission layer, a reflection electrode formed below the light-emission layer and reflecting light from the light-emission layer upwards, and an upper electrode formed above the light-emission layer and having a light transmission property and reflectivity; a structure for resonating the light emitted by the light-emission layer is formed between the reflection electrode and the upper electrode; and the filling layer includes fine particles for diffusing light exiting from the upper electrode added therein.

4 Claims, 3 Drawing Sheets

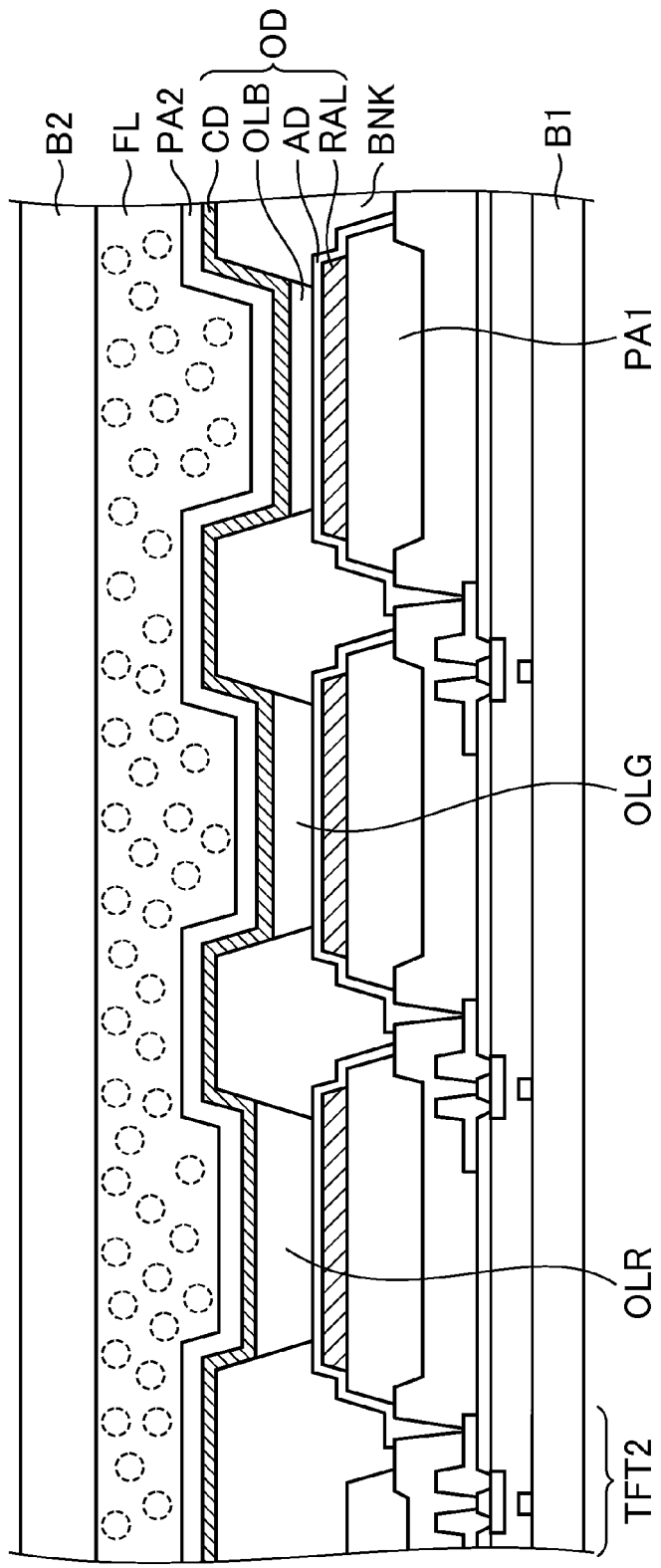

ORGANIC EL DISPLAY DEVICE

CROSS-REFERENCE TO RELATED APPLICATION

The present application claims priority from Japanese application JP2013-000247 filed on Jan. 4, 2013, the content of which is hereby incorporated by reference into this application.

BACKGROUND OF THE INVENTION

1. Field of the Invention

The present invention relates to an organic EL display device.

2. Description of the Related Art

In a top emission type organic EL display device, a micro-cavity structure is known which utilizes a light resonance effect between two electrodes constituting an organic EL device to enhance the intensity of extracted light.

In the micro-cavity structure, reflection is repeated between a reflection electrode formed under a light-emission layer and a semi-transparent electrode formed on the light-emission layer. The thicknesses of respective layers stacked between the two electrodes are set in such a manner that light emitted by the light-emission layer is enhanced and extracted to a top side.

JP H11-329742 A describes that a light diffusion color filter having a light diffusion property is provided on a light-extraction side of an organic light-emission layer.

SUMMARY OF THE INVENTION

In the top emission type organic EL display device having the micro-cavity structure, high-luminance light can be extracted on the front side. However, the intensity of light may be easily reduced in an oblique direction.

Moreover, in a case of providing the light diffusion color filter, the viewing angle characteristics are improved. However, light is diffused within the color filter and therefore light exiting to the outside can be easily attenuated in the color filter, resulting in reduction in luminance.

In view of the above problems, it is an object of the invention to provide a top emission type organic EL display device which can achieve a lower reduction in luminance and can improve the viewing angle characteristics. The above and other objects and novel features of the invention will be made apparent by the description in this specification and the accompanying drawings.

In view of the above problems, an organic EL display device according to the invention includes a first substrate, a plurality of organic EL devices arranged on the first substrate, a second substrate arranged above the first substrate, a filling layer arranged between the first substrate and the second substrate, and displays an image on the second substrate side. The organic EL display device is characterized in that the organic EL devices each include a light-emission layer, a reflection electrode formed below the light-emission layer and reflecting light from the light-emission layer upwards, and an upper electrode formed above the light-emission layer and having a light transmission property and reflectivity, a structure for resonating the light emitted by the light-emission layer is formed between the reflection electrode and the upper electrode, and the filling layer includes fine particles for diffusing the light resonated by the structure and exiting from the upper electrode, added therein.

In an aspect of the organic EL display device according to the invention, the organic EL display device may be characterized in that the fine particles having diameters from 300 nm to 30 μm are included in the filling layer.

In another aspect of the organic EL display device according to the invention, the organic EL display device may be characterized in that the second substrate includes a color filter layer formed to correspond to the plurality of organic EL devices, respectively, and a black matrix.

In still another aspect of the organic EL display device according to the invention, the organic EL display device may be characterized in that the light-emission layers of the plurality of organic EL devices are formed to be painted in a plurality of colors to emit light of the plurality of colors.

According to the invention, a top emission type organic EL display device can be provided, which can achieve a lower reduction in luminance and can improve the viewing angle characteristics.

BRIEF DESCRIPTION OF THE DRAWINGS

FIG. 3 is a schematic cross-sectional view of an organic EL display device according to a second preferred embodiment of the invention.

DETAILED DESCRIPTION OF THE INVENTION

Figure 1:
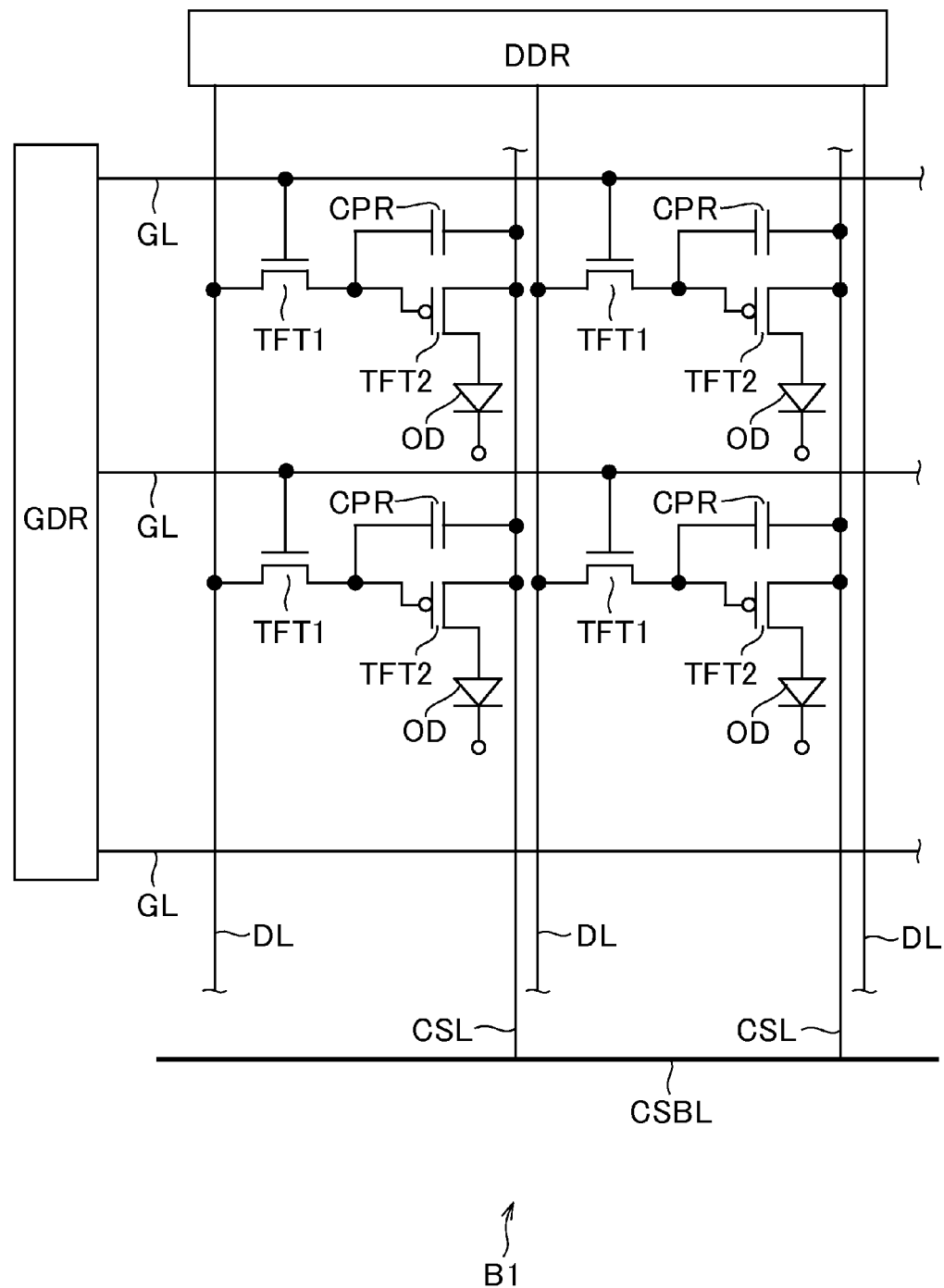
FIG. 1 is an equivalent circuit diagram of an organic EL display device according to a first preferred embodiment of the invention.

Organic EL display devices according to respective preferred embodiments of the invention will be described below, referring to the drawings.

First Preferred Embodiment

An organic EL display device according to the first preferred embodiment is a top emission type organic EL display device and is configured to include a first substrate B1 (organic EL device substrate) on which organic EL devices are formed in a matrix on the pixel-by-pixel basis, a second substrate B2 arranged on a side of the first substrate B1 on which a display region for displaying an image is formed, and a filling layer FL arranged between the first substrate B1 and the second substrate B2.

FIG. 1 is a circuit diagram of an exemplary circuit provided on the first substrate B1 in the above-described organic EL display device. On the first substrate B1 in FIG. 1, a number of scanning lines GL extend horizontally in FIG. 1 with a regular interval therebetween, and a number of video signal lines DL extend vertically in FIG. 1 with a regular interval therebetween. The scanning lines GL and the video signal lines DL section respective pixels arranged in a matrix on the first substrate B1. For each pixel, a thin film transistor TFT1 which has an MIS (Metal-Insulator-Semiconductor) structure and is used for switching, a thin film transistor TFT2 used for driving a light-emission device, a storage capacitor CPR, and an organic EL device OD are formed. A power supply lines CSL for supplying a power source to the organic EL device OD extends vertically in FIG. 1 parallel to the video signal lines DL. The scanning lines GL and the video signal lines DL are connected to and driven by a scanning line driving circuit GDR and a video line driving circuit DDR, respectively. Each power supply line CSL is connected to a power supply bus line CSBL from which a current is supplied.

In the circuit diagram of FIG. 1, when a row of pixels is selected by application of a gate voltage to a scanning line GL and a video signal is supplied from a video signal line DL, the thin film transistor TFT1 for switching is turned ON and the storage capacity CPR is charged. When the storage capacity CPR is charged, the thin film transistor TFT2 for driving which supplies a current to the organic EL device OD is turned on. Thus, the current flows from the power supply line CSL to the organic EL device, so that the organic EL device emits light.

Figure 2:
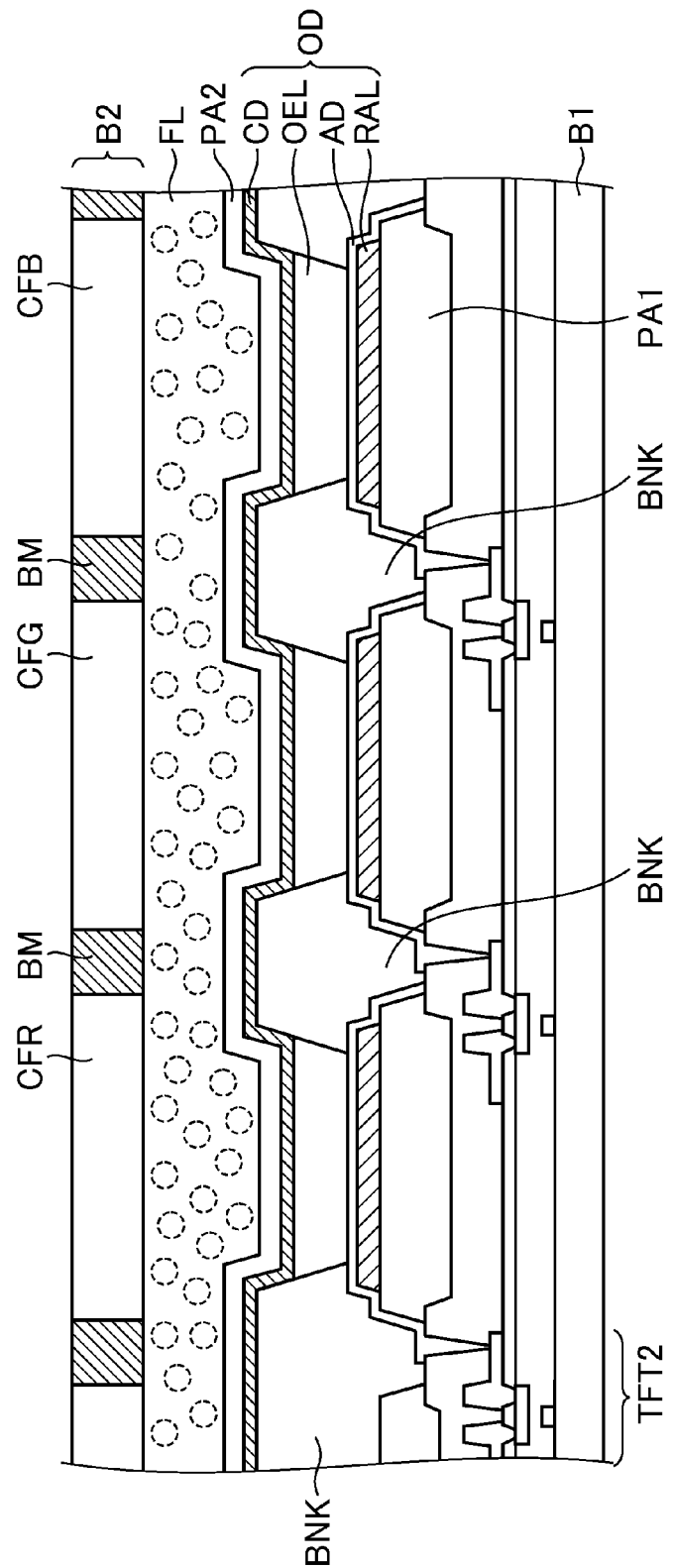
FIG. 2 is a schematic cross-sectional view of the organic EL display device according to the first preferred embodiment.

FIG. 2 is a schematic cross-sectional view of the organic EL display device of this preferred embodiment, showing one pixel formed by sub-pixels including an R-pixel, a G-pixel and a B-pixel. As shown in FIG. 2, the thin film transistor TFT2 is formed on the surface of the first substrate B1. The voltage applied to the gate electrode of the thin film transistor TFT2 is controlled by the thin film transistor TFT1 (not shown in FIG. 2) via the storage capacity CPR (not shown in FIG. 2), thereby the current flowing to the lower electrode AD is controlled.

The organic EL device OD is arranged on a protection layer PA1 and is formed while being surrounded by a bank layer BNK which sections a pixel region in a grid. This organic EL device OD is formed by arranging an organic light-emission layer OEL (organic EL film) between a lower electrode AD and a semi-transparent upper electrode CD provided on the upper side.

Under the lower electrode AD, the reflection electrode RAL is arranged. The upper electrode CD is covered by a protection layer PA2 formed by an SiN film for shielding the organic EL device OD from water and an air.

The lower electrode AD in this preferred embodiment is formed of indium tin oxide (ITO) capable of transmitting light. The reflection electrode RAL is formed from metal such as aluminum to have high reflectivity. The upper electrode CD is formed by using an alloy film containing metal such as aluminum or silver in such a thickness that it can transmit light, thereby having a light transmission property and reflectivity. The upper electrode CD serves as a cathode and is formed over an approximately entire surface in a display region which displays a video as an electrode common to the respective pixel regions. The lower electrode AD serves as an anode. The lower electrode AD and the reflection electrode RAL are formed in each pixel region individually. The organic light-emission layer OEL is formed by stacking a hole transportation layer, a light-emission layer, and an electron transportation layer in that order from the bottom. The organic light-emission layer OEL in this preferred embodiment emits white light and is formed to have the same thickness in the R-, G-, and B-pixels, as shown in FIG. 2.

In the light-emission layer in the organic light-emission layer OEL, a hole injected from the lower electrode AD and an electron injected from the upper electrode CD are recombined, thereby light is emitted. Moreover, the organic EL display device in this preferred embodiment is a top emission type in which an image is displayed on the side of the first substrate B1 on which the organic EL devices OD are formed, and light emitted from the organic light-emission layer OEL is repeatedly reflected between the reflection electrode RAL and the upper electrode CD and is then extracted from the upper electrode CD which is semi-transparent. In other words, in the organic EL display device of this preferred embodiment, a micro-cavity structure is employed in which a light resonance effect is made to occur between the reflection electrode RAL and the upper electrode CD. The thicknesses of the respective layers in the organic light-emission layer OEL are strictly controlled in such a manner that white light extracted in a direction perpendicular to the upper electrode CD is enhanced by interference.

In the organic EL display device of this preferred embodiment, fine particles each having diameters from 300 nm to 30 µm are mixed in the filling layer FL arranged between the first substrate B1 and the second substrate B2. Due to the fine particles, light exiting from the upper electrode CD perpendicularly is diffused and enters a red color filter layer CFR, a green color filter layer CFG, and a blue color filter CFB which are formed in the second substrate B2. The diameters of the fine particles are desirably measured by dynamic light scattering. In this specification, an average particle diameter means a volume average particle diameter unless specifically stated.

Therefore, in the organic EL display device of this preferred embodiment, light extraction efficiency is improved by the micro-cavity structure. Also, emitted light having high directionality in the perpendicular direction is diffused in the filling layer FL and then enters the respective color filter layers, thereby the viewing angle characteristics are improved. In addition, because the light is diffused before entering to the second substrate B2 having the black matrix BM, improvement of the viewing angle characteristics can be achieved with reducing adverse effects on adjacent pixels.

The organic EL light-emission layer OEL can be formed by vapor deposition or printing. The filling layer FL is formed by dropping a filling material with light diffusion fine particles mixed therein by means of a dispenser to the inside of a dam member which is formed along an outer periphery of the first substrate B1 to surround a region where the filling layer FL is to be formed. Then, the first substrate B1 is bonded to the second substrate B2 by pressurization or a vacuum process, for example, and thereafter a process such as light curing or heat curing is performed, as necessary. When the second substrate B2 is bonded to the first substrate B1, the second substrate B2 is placed on the first substrate B1 in such a manner that the positions of the color filter layers CFR, CFG, and CFB are aligned with the organic EL devices OD, respectively. By mixing the light diffusion fine particles into the filling material to be dropped as the filling layer FL, the light diffusion layer for improving the viewing angle characteristics of the organic EL display device having the micro-cavity structure can be formed without largely increasing the manufacturing processes.

For evenly diffusing light in a visible region, the light diffusion fine particles to be mixed into the filling layer FL desirably include fine particles having particle sizes from 300 nm to 700 nm (fine particles having an average particle diameter from 300 nm to 700 nm) corresponding to the wavelength of the light emitted by the organic EL device OD. Moreover, as the light diffusion fine particles to be added in the filling layer FL, fine particles having particle sizes from 300 nm to 500 nm (fine particles having an average particle diameter from 300 nm to 500 nm) corresponding a blue component of white light may be contained, so that light having a wavelength of 400 nm, corresponding to blue light, is more strongly scattered than light having wavelengths of 500 nm and 600 nm, corresponding to green light and red light. Because the wavelength corresponding to blue light is shorter than other wavelengths, control of the film thickness for making the light resonance effect occur tends to be strict. However, by making fine particles having diameters from 300 nm to 500 nm or from 350 nm to 450 nm (fine particles having an average particle diameter from 300 nm to 500 nm or from 350 nm to 450 nm) be contained, for example, blue emitted light can be strongly scattered to compensate the display characteristics of the organic EL display device. Also, likelihood of process can be improved.

The light diffusion fine particles may be inorganic material or organic material. When the light diffusion fine particles are mixed in the filling material, dispersant may be added which promotes dispersion of the fine particles. Moreover, the filling layer FL may be formed by resin for sealing each organic EL device OD, and may be configured to further contain desiccant for protecting the organic EL devices OD from water.

Second Preferred Embodiment

Next, an organic EL display device according to the second preferred embodiment of the invention is described. The organic EL display device of the second preferred embodiment is a top emission type organic EL display device as in the first preferred embodiment, but is different from the organic EL display device of the first preferred embodiment in that the respective organic EL light-emission layers OEL are formed to be painted in three colors including R, G, and B.

FIG. 3 is a schematic cross-sectional view of the organic EL display device of the second preferred embodiment, showing one pixel constituted by sub-pixels including an R-pixel, a G-pixel, and a B-pixel. As shown in FIG. 3, in the organic EL display device of the second preferred embodiment, organic EL light-emission layers OLR, OLG and OLB which emit red light, green light, and blue light, respectively, and have different thicknesses from one another are formed, and three kinds of organic EL devices OD are formed which respectively emit red light, green light, and blue light. The respective layers forming the organic EL light-emission layers OLR, OLG, and OLB have thicknesses each of which is individually determined to enhance emission of red light, green light, and blue light by the resonance effect between the reflection electrode RAL and the upper electrode CD.

In the organic EL display device in the second preferred embodiment, a structure for resonating light is employed in each of the organic EL light-emission layers OLR, OLG, and OLB. Therefore, light emission efficiency and color purity of each of red light, green light, and blue light can be improved. In addition, the filling layer FL with the fine particles from 300 nm to 30 μm (or fine particles having an average particle diameter from 300 nm to 30 μm) added therein can diffuse strongly directional emitted light having high luminance in the front direction. Thus, the viewing angle characteristics can be improved.

Moreover, in the organic EL display device of the second preferred embodiment, the second substrate B2 is configured to include a linear polarizing plate and a retardation plate to have a function of a circular polarizing plate. Also in the second substrate B2 of the organic EL display device of the first preferred embodiment, for example a linear polarizing plate and a retardation plate may be arranged in the outside of the color filter layers CFR, thereby having a function of a circular polarizing plate.

The light diffusion fine particles mixed in the filling layer FL of the second preferred embodiment desirably include particles having particle sizes from 300 nm to 700 nm (fine particles having an average particle diameter from 300 nm to 700 nm) as in the first preferred embodiment. Moreover, by making the filling layer FL contain fine particles having particle sizes from 300 nm to 500 nm (or from 350 nm to 450 nm) corresponding to the blue organic EL device ODB, the display characteristics of the organic EL display device can be compensated and the likelihood of the process can be also improved. Moreover, the light diffusion fine particles to be mixed into the filling layer FL desirably include fine particles having an average particle diameter from 300 nm to 500 nm (or from 350 nm to 450 nm). Furthermore, for example, the light diffusion fine particles may be added in the filling layer FL so that one of blue emitted light, green emitted light, and red emitted light is more strongly scattered than others and the area of the organic EL light-emission layer corresponding to that one emitted light may be formed to be smaller than the areas of the organic EL light-emission layers corresponding to other emitted light.

In the above-described preferred embodiments, light of three colors including red, green, and blue is extracted from the second substrate B2 side. Alternatively, the second substrate B2 of the first preferred embodiment may include a white color filter to form an image with four colors including red, green, blue, and white, or in the second preferred embodiment an organic EL light-emission layer for emitting white light may be formed by being painted in white separately. Moreover, even in the organic EL display device in which the organic EL light-emission layers are painted in different colors as in the second preferred embodiment, color filters or a black matrix may be formed in the second substrate B2. Furthermore, the organic EL display devices of the respective preferred embodiments have a circuit structure shown in FIG. 1, but may have a different circuit structure from FIG. 1.

The invention is not limited to the above-described preferred embodiments, but can be modified in various ways. For example, the structure described in each preferred embodiment can be replaced with substantially the same structure, the structure providing the same operation and effects, or the structure which can achieve the same object.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An organic EL display device comprising:
   a first substrate;
   a plurality of organic EL devices on the first substrate;
   a second substrate facing the first substrate; and
   a filling layer between the first substrate and the second substrate,
   wherein
   an image is displayed on a second substrate side,
   each of the plurality of organic EL devices includes:
      a light-emission layer;
      a reflection electrode below the light-emission layer to reflect light from the light-emission layer upwards;
      a bank configured to cover an edge of the reflection electrode; and
      an upper electrode above the light-emission layer and having a light transmission property and reflectivity,
   a structure which resonates the light emitted from the light-emission layer is formed between the reflection electrode and the upper electrode,
   the filling layer includes fine particles dispersed therein configured to uniformly diffuse the light in a visible wavelength region resonated by the structure and exiting from the upper electrode,
   the second substrate has a black matrix,
   the filling layer spreads under the black matrix and over the plurality of the organic EL devices, continuously, and
   the fine particles are dispersed in the filling layer both above the reflection electrode and between the black matrix and the bank.

2. An organic EL display device according to claim 1, wherein the second substrate has a color filter layer formed to respectively correspond to the plurality of organic EL devices.

3. An organic EL display device according to claim 1, wherein the light-emission layers of the plurality of organic EL devices are formed to be painted in a plurality of color, respectively, to emit light of the plurality of colors.

4. An organic EL display device according to claim 1, wherein
- the plurality of the organic EL devices are covered by a protection layer for being shielded from water,
- the protection layer is formed between the upper electrode and the filling layer,
- the filling layer has a thickness, and
- the upper electrode and the filling layer are spaced at an interval which is smaller than the thickness of the filling layer.

\* \* \* \* \*